United States Patent
Su et al.

(10) Patent No.: US 7,838,896 B2
(45) Date of Patent: Nov. 23, 2010

(54) LIGHT EMITTING APPARATUS WITH OPEN LOOP CONTROL

(75) Inventors: Hung-Yuan Su, Taipei (TW); Ru-Shi Liu, Hsinchu (TW)

(73) Assignee: Lite-On Technology Corporation, Taipei (TW)

( * ) Notice: Subject to any disclaimer, the term of this patent is extended or adjusted under 35 U.S.C. 154(b) by 153 days.

(21) Appl. No.: 12/068,577

(22) Filed: Feb. 8, 2008

(65) Prior Publication Data
US 2009/0015137 A1      Jan. 15, 2009

(30) Foreign Application Priority Data
Jul. 13, 2007    (TW)  ............... 96125539 A

(51) Int. Cl.
*H01J 1/62* (2006.01)
*H01L 33/44* (2010.01)

(52) U.S. Cl. .............. 257/98; 257/100; 257/789; 257/790; 257/E33.061; 257/E33.059; 313/485; 313/503

(58) Field of Classification Search ............ 257/98, 257/100, 789, 790, E33.061, E33.059, 79, 257/E33.001; 313/485, 503
See application file for complete search history.

(56) References Cited

U.S. PATENT DOCUMENTS

| | | | |
|---|---|---|---|
| 5,959,316 A | 9/1999 | Lowery | |
| 6,066,861 A | 5/2000 | Hohn et al. | |
| 6,245,259 B1 | 6/2001 | Hohn et al. | |
| 6,417,019 B1 | 7/2002 | Mueller et al. | |
| 6,576,488 B2 | 6/2003 | Collins, III et al. | |
| 6,590,235 B2 | 7/2003 | Carey et al. | |
| 6,753,646 B1 * | 6/2004 | Liu et al. | 313/512 |
| 6,759,803 B2 | 7/2004 | Sorg | |
| 6,812,500 B2 | 11/2004 | Reeh et al. | |
| 7,126,273 B2 | 10/2006 | Sorg | |
| 7,311,858 B2 * | 12/2007 | Wang et al. | 252/301.4 F |
| 2004/0135504 A1 * | 7/2004 | Tamaki et al. | 313/512 |
| 2005/0212397 A1 * | 9/2005 | Murazaki et al. | 313/487 |
| 2007/0223219 A1 * | 9/2007 | Medendorp et al. | 362/231 |

OTHER PUBLICATIONS

Luo et al., Hong; Analysis of high-power packages for phosphor-based white-light-emitting diodes; Applied Physics Letters 86, 243505-1-3; 2005, American Institute of Physics.
Kim et al., Jong Kyu; Light Extraction in GaInN Light-Emitting Diodes using Diffuse Omnidirectional Reflectors; Journal of the Electrochemical Society, 153 (2); G105-G107; 2005, The Electrochemical Society.
Kim et al., Jong Kyu; Strongly Enhanced Phosphor Efficiency in GaInN White Light-Emitting Diodes Using Remote Phosphor Configuration and Diffuse Reflector Cup; Japanese Journal of Applied Physics; 2005; pp. L649-L651vol. 44, No. 21, The Japan Society of Applied Physics.

* cited by examiner

*Primary Examiner*—Ngan Ngo
*Assistant Examiner*—Benjamin Tzu-Hung Liu
(74) *Attorney, Agent, or Firm*—Bacon & Thomas, PLLC

(57) ABSTRACT

A light emitting apparatus includes a blue light emitting diode (LED), a first and second phosphor layers. The second phosphor layer is between the blue LED and the first phosphor layer. When a blue beam of a shorter wavelength excites the phosphor layers, the excitation efficiency of the first phosphor layer is greater than that of the second phosphor layer. When a blue beam of a longer wavelength excites the phosphor layers, the excitation efficiency of the first phosphor layer is less than that of the second phosphor layer. Moreover, the wavelength of the peak intensity of the light beam from the first phosphor layer is shorter than that of the second phosphor layer. And, the dividing value between the shorter wavelength and the longer wavelength is within the range from a first wavelength to a second wavelength.

18 Claims, 6 Drawing Sheets

LIGHT EMITTING APPARATUS WITH OPEN LOOP CONTROL

This application claims the benefit of Taiwan application Serial No. 96125539, filed Jul. 13, 2007, the subject matter of which is incorporated herein by reference.

BACKGROUND OF THE INVENTION

1. Field of the Invention

The invention relates in general to a light emitting apparatus, and more particularly to a light emitting apparatus with open loop control.

2. Description of the Related Art

Products that make use of light emitting diodes (LED) are, for example, backlights of liquid crystal display (LCD) devices, lighting devices for particular uses and vehicles, etc. In 2005, LEDs had a marketing value of 6.235 billion dollars worldwide. And in 2006, it had increased to 6.873 billion dollars. Therefore, it is anticipated that products utilizing LEDs will steadily increase in number and variety in the future. At present, white LEDs are commonly used as light sources for providing white light. A known method for fabricating a white LED is to integrate several light emitting chips of different colors. Another known method is to use phosphor powders to assist an LED to emit white light. Some of the methods for fabricating a white LED are elaborated in detail below.

In the first method, three LEDs that have indium gallium aluminum phosphide (InGaAlP), gallium phosphide (GaP) and gallium nitride (GaN) are used. Different currents are provided to the three LEDs to activate them to emit a red beam, a green beam and a blue beam, respectively, so as to produce a white beam. In second method, two LEDs made from gallium nitride (GaN) and indium gallium aluminum phosphide (InGaAlP) receive different currents which activates them emit, respectively, a blue beam and a yellowish green beam, or a green beam and a red beam, both of which generate a white beam.

The above two methods are able to automatically control the chromaticity coordinate of the white light emitted by tuning the currents to adjust the spectrum of a mixed light beam. However, control circuits for the first and second methods are far more complicated and, hence, increase the manufacturing cost.

Nichia Chemical Ltd of Japan in 1996 developed a blue LED that is composed of indium gallium nitride (InGaN) and yttrium aluminum garnet phosphor. The yellow beam from the phosphor and the blue beam from the LED combine to generate a white beam.

Sumitomo Electric Industries Ltd of Japan in January of 1999 developed a white LED that is made from zinc selenide (ZnSe). A cadmium zinc selenide (CdZnSe) thin film, which is formed on a zinc selenide single chip substrate, emits a blue beam when receiving a current. Meanwhile, part of the blue beam projects onto the single chip substrate which then emits a yellow beam. The blue and yellow beams are complementary colors and combine to form a white beam. Moreover, a UV light beam can be used to excite different phosphors to generate different color beams to form a white beam.

However, the chromaticity coordinate of the white beam generated by an LED and phosphor is related to the light beams from the LED and phosphor, and cannot be compensated automatically. Thus, the white light beam cannot be made to have a constant chromaticity coordinate.

SUMMARY OF THE INVENTION

It is therefore an object of the invention to provide a light emitting apparatus with open loop control. The light emitting apparatus makes use of two phosphor materials and a blue LED to produce a beam of white light. The variety and amount of the phosphor materials are determined in advance, so that the chromaticity coordinate of the white beam from the light emitting apparatus is automatically maintained at a constant position.

The invention achieves the above-identified object by providing a light emitting apparatus that includes a blue LED, a first phosphor layer and a second phosphor layer. The first phosphor layer is disposed above the blue LED and has a first phosphor material that is excited by a blue beam from the blue LED. The second phosphor layer is between the blue LED and the first phosphor layer and has a second phosphor material that is excited by the blue beam from the blue LED. When a blue beam of a shorter wavelength excites the first and second phosphor layers, the excitation efficiency of the first phosphor layer is greater than that of the second phosphor layer. When a blue beam of a longer wavelength excites the first and second phosphor layers, the excitation efficiency of the first phosphor layer is less than that of the second phosphor layer. The wavelength of the peak intensity of the light beam from the first phosphor layer is shorter than that of the second phosphor layer. In addition, the dividing value between the shorter wavelength and the longer wavelength is within the range from a first wavelength to a second wavelength.

The invention achieves the above-identified object by providing another light emitting apparatus that includes a blue LED and a phosphor layer. The phosphor layer covers the blue LED and has a first phosphor material and a second phosphor material, wherein the phosphor materials are excited by a blue beam from the blue LED. When a blue beam of a shorter wavelength excites the first and second phosphor materials, the excitation efficiency of the first phosphor material is greater than that of the second phosphor material. When a blue beam of a longer wavelength excites the first and second phosphor materials, the excitation efficiency of the first phosphor material is less than that of the second phosphor material. The wavelength of the peak intensity of the light beam from the first phosphor material is shorter than that of the second phosphor material. Moreover, the dividing value between the shorter wavelength and the longer wavelength is within the range from a first wavelength to a second wavelength.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 1:
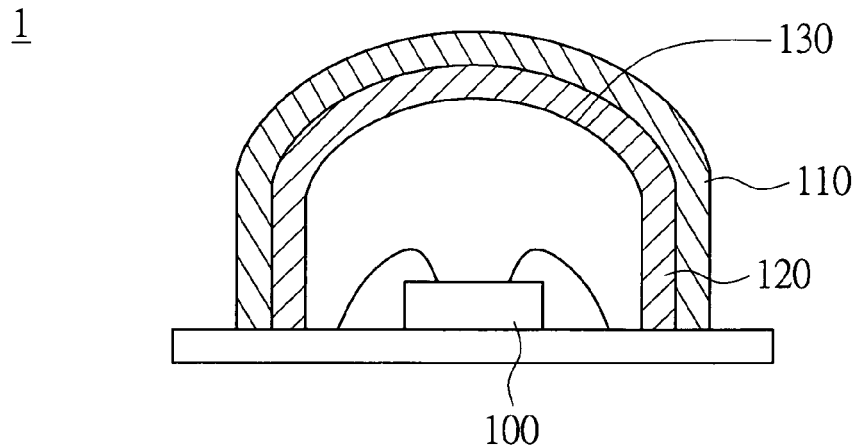
FIG. 1 is a diagram showing a light emitting apparatus according to a first embodiment of the invention.
Figure 2:
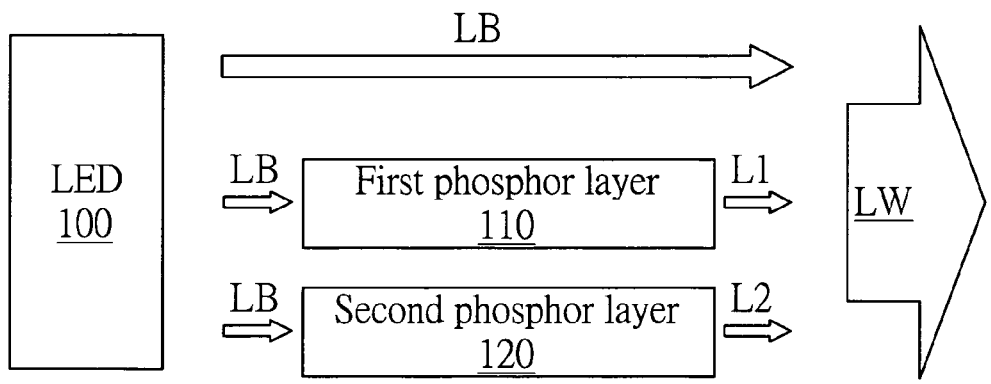
FIG. 2 is a system diagram showing the chromaticity coordinate control of the light emitting apparatus in FIG. 1.

FIG. 1 is a diagram showing a light emitting apparatus according to a first embodiment of the invention, and FIG. 2 is a system diagram showing the chromaticity coordinate control of the light emitting apparatus in FIG. 1. The light emitting apparatus 1 includes a blue LED 100, a first phosphor layer 110 and a second phosphor layer 120. The first phosphor layer 110 is disposed above the blue LED 100 and has a first phosphor material that is excited by a blue beam LB from the blue LED 100. The second phosphor layer 120 is disposed between the blue LED 100 and the first phosphor layer 110, and has a second phosphor material that is also excited by the blue beam LB from the blue LED 100. When a blue beam of a shorter wavelength excites the first phosphor layer 110 and the second phosphor layer 120, the excitation efficiency of the first phosphor layer 110 is greater than that of the second phosphor layer 120. When a blue beam of a longer wavelength excites the first phosphor layer 110 and the second phosphor layer 120, the excitation efficiency of the first phosphor layer 110 is less than that of the second phosphor layer 120. Moreover, the wavelength of the peak intensity of the beam from the first phosphor layer 110 is shorter than that of the second phosphor layer 120. In addition, the dividing value between the shorter wavelength and the longer wavelength is within the range from a first wavelength to a second wavelength. Preferably, the first wavelength is approximately 440 nm, and the second wavelength is approximately 480 nm.

The light emitting apparatus 1 further includes a transparent sealed body 130 for receiving the blue LED 100. The second phosphor layer 120 is disposed over the transparent sealed body 130, and the first phosphor layer 110 is disposed over the second phosphor layer 120. The material of the transparent sealed body 130 is, for example, silica gel. The second phosphor layer 120 is, for example, a thin film that is formed on the transparent sealed body 130 by coating. The first phosphor layer 110 is, for example, another thin film that is formed on the second phosphor layer 110 by coating as well. That is, both the first and second phosphor layers 110 and 120 are remote phosphors for the blue LED 100 in the light emitting apparatus 1.

Figure 3:
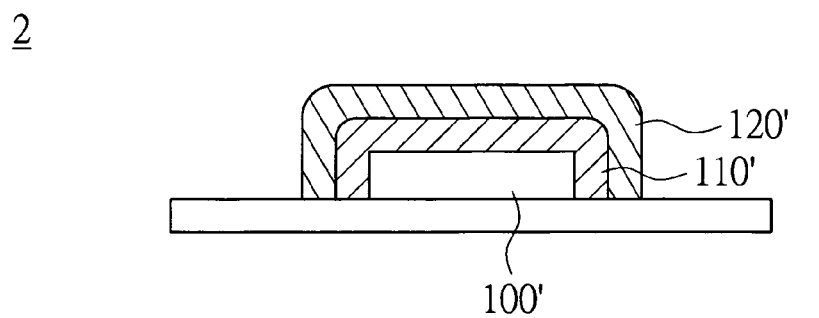
FIG. 3 is a diagram showing that phosphor layers are conformal phosphors.

In addition, the phosphor layers in a light emitting apparatus can be conformal phosphors. FIG. 3 is a diagram showing that phosphor layers are conformal phosphors. The first phosphor layer 110' and the second phosphor layer 120' of the light emitting apparatus 1' are disposed directly on the blue LED 100' to form as a double-layer thin film. The phosphor layer 110' and 120' are coated on, for example, the blue LED 100'.

As shown in FIG. 1, since the phosphor layers 110 and 120 are separated from the blue LED 100, the volume of the light emitting apparatus 1 is enlarged by the space between the LED 100 and the phosphor layers 110 and 120, and the size of the light emitting area is increased, thereby producing more light. As for the light emitting apparatus 1' in FIG. 3, the first and second phosphor layers 110' and 120' completely cover the outer surface of the blue LED 100', so that the light emitting apparatus 1' has significant luminous intensity and is capable of emitting a concentrated light beam. The light emitting apparatus 1 and 1' differ in structure, and so, they can be applied in the same or in different varieties of products.

In FIGS. 1 and 2, the light emitting apparatus 1 and 1' have the second phosphor layers 120 and 120' closest to the blue LEDs 100 and 100', and the first phosphor layers 110 and 110' over the second phosphor layers 120 and 120'. The positions of the first and second phosphor layers in the double-layer thin film are determined based on their excitation characteristics and are elaborated below.

As shown in FIG. 2, the light LED 100, and the first and second phosphor layers 110 and 120 constitute an open loop system. The first and second phosphor layers 110 and 120 have different excitation characteristics under the wavelength conditions of different excitation sources. In addition, the wavelength of the peak intensity of the light beam from the first phosphor layer 110 is shorter than that of the second phosphor layer 120. When the wavelength of the blue beam LB from the LED 100 changes, the chromaticity coordinate of the mixed light beam (L1+L2) from the phosphor layers 110 and 12 changes accordingly, thereby maintaining the chromaticity coordinate of the white beam LW at a constant position.

Figure 4:
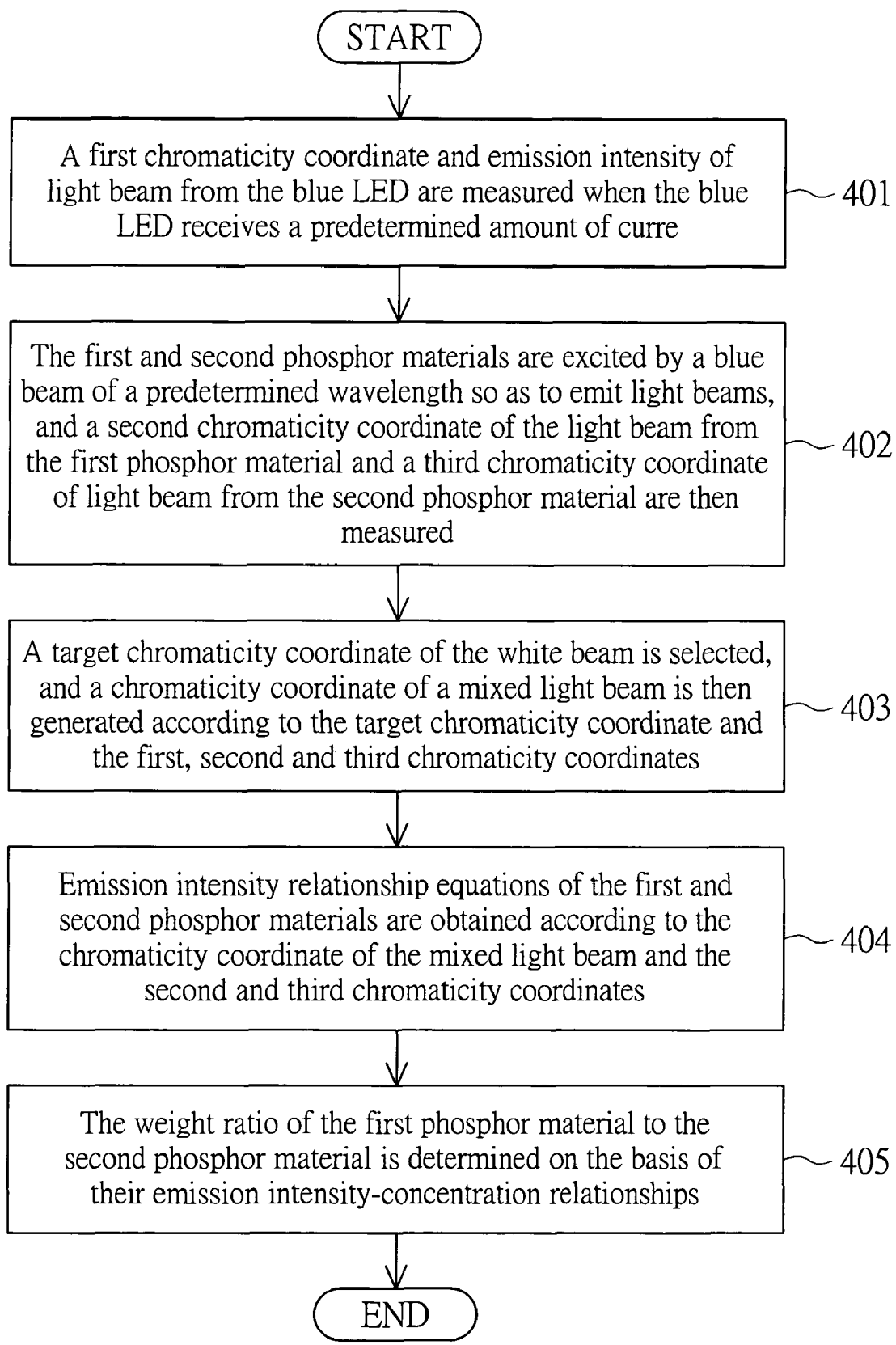
FIG. 4 is a flowchart of the method for preparing the first and second phosphor materials.

The first and second phosphor materials of the phosphor layers 110 and 120 are prepared in advance according to their weight ratio before being disposed on the light emitting apparatus 1. FIG. 4 is a flowchart of the method for preparing the first and second phosphor materials. The method includes steps 401 to 405. In step 401, a first chromaticity coordinate and emission intensity of the light beam from the blue LED 100 are measured when the blue LED 100 receives a predetermined amount of current. In step 402, the first and second phosphor materials are excited by a blue beam of a predetermined wavelength so as to emit light beams. A second chromaticity coordinate of the light beam from the first phosphor material and a third chromaticity coordinate of the light beam from the second phosphor material are then measured. In step 403, a target chromaticity coordinate of the white beam is selected. Then a chromaticity coordinate of a mixed light beam is generated according to the target chromaticity coordinate and the first, second and third chromaticity coordinates. In step 404, according to the chromaticity coordinate of the mixed light beam and the second and third chromaticity coordinates, emission intensity relationship equations of the first and second phosphor materials are obtained. In step 405, the weight ratio of the first phosphor material to the second phosphor material is determined on the basis of their emission intensity-concentration relationships.

In the present embodiment, the first phosphor material is, for example, a phosphor whose synthetic mixture is $(Sr, Ba)_2SiO_4:Eu$ and chemical expression is $(Sr_{0.35}Ba_{1.6}Eu_{0.05})SiO_4$. The first phosphor material can be synthesized by the use of a solid-state reaction method. The second phosphor material is, for example, a phosphor whose synthetic mixture is $(Y_3Al_5O_{12}:Ce, Gd)$ and chemical expression is $(Y_{2.3}Ce_{0.05}Gd_{0.65})Al_5O_{12}$. The second phosphor material can be synthesized by using a solid-state reaction method or a chemical synthesis method (such as citric acid gel method or co-precipitation synthesis method).

Figure 5:
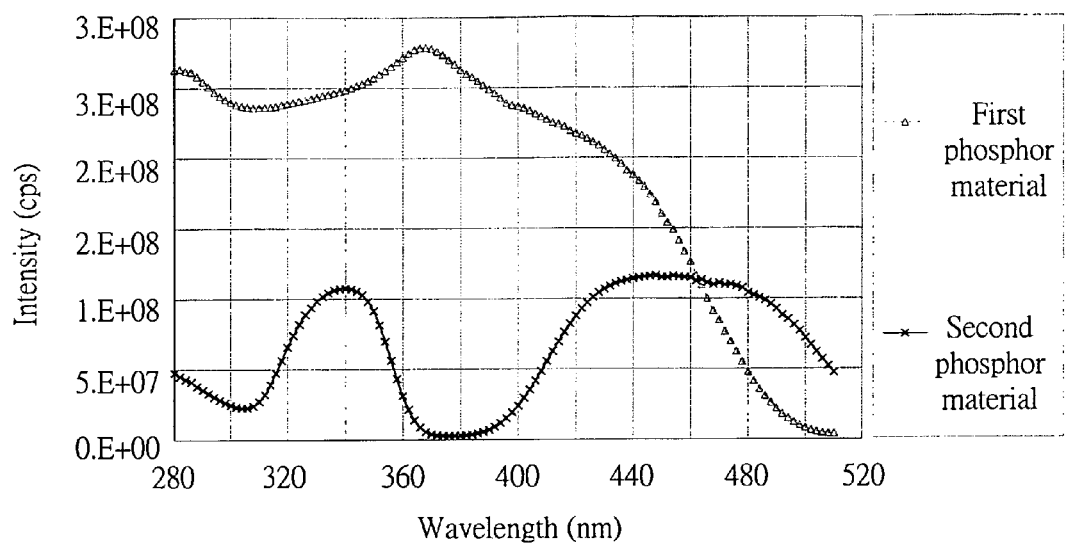
FIG. 5 is a diagram showing the excitation spectrums of the first and second phosphor materials.

FIG. 5 is a diagram showing the excitation spectrums of the first and second phosphor materials. The excitation spectrum of the first phosphor material is detected under the condition that an excitation light beam whose wavelength is 522 nm is used. The excitation spectrum of the second phosphor material is detected under the condition that an excitation light beam whose wavelength is 548 nm is used. As shown in FIG. 5, the intensity curves of the first and the second phosphor materials intersect at a wavelength of 462 nm. Around the 462 nm wavelength, the intensities of the light beams from the first and second phosphor materials are inversely proportional to the wavelength of the blue beam. That is, when a blue beam of a wavelength less than 462 nm excites the first and second phosphor materials, the excitation efficiency of the first phosphor material is higher than that of the second phosphor material. When a blue beam of a wavelength greater than 462 nm excites the first and second phosphor materials, the excitation efficiency of the first phosphor material is lower than that of the second phosphor material.

Therefore, the phosphor material of the first phosphor layer 110 and the phosphor material of the second phosphor layer 120 do indeed meet the condition that the value dividing the shorter wavelength and the longer wavelength of blue beams is within the range from 440 nm to 480 nm.

Figure 6A:
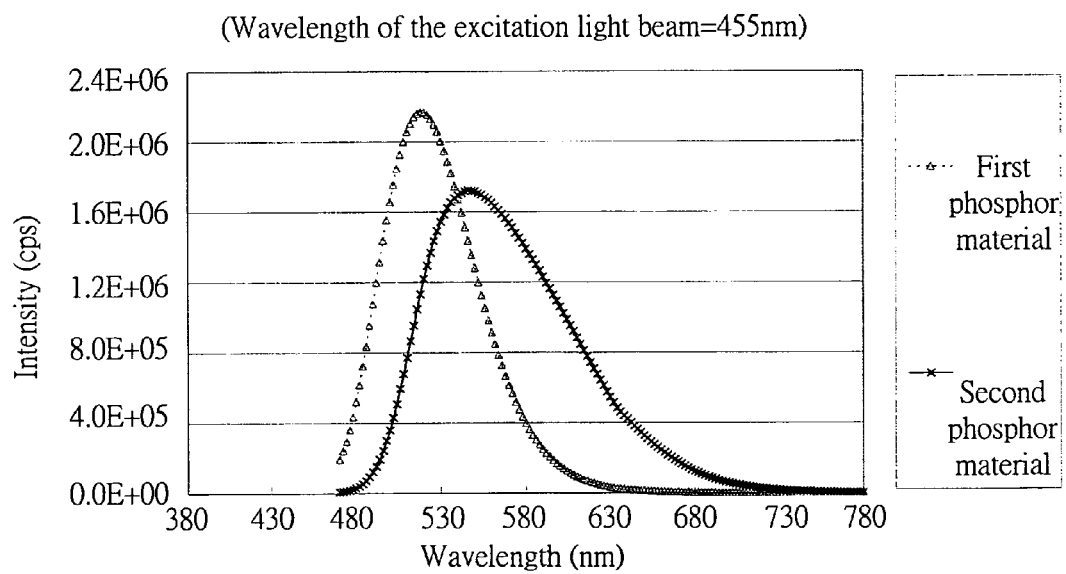
FIG. 6A is a diagram showing the excitation spectrums of the first and second phosphor materials excited by a light beam whose wavelength is 455 nm.
Figure 6B:
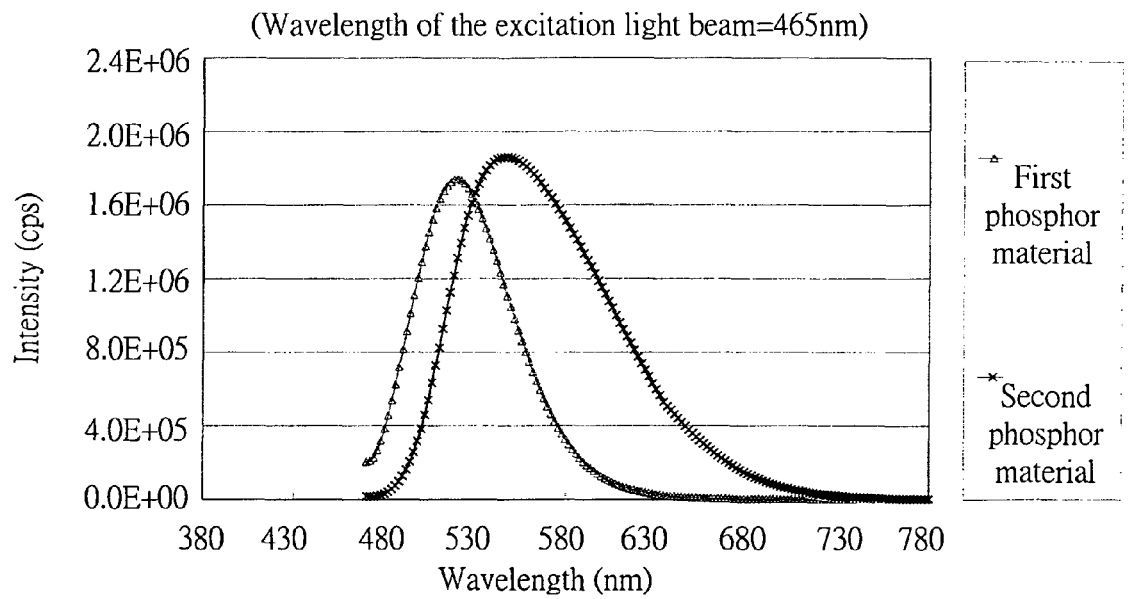
FIG. 6B is diagram showing the excitation spectrums of the first and second phosphor materials excited by a light beam whose wavelength is 465 nm.

FIG. 6A is a diagram showing the excitation spectrums of the first and second phosphor materials excited by a light beam whose wavelength is 455 nm, and FIG. 6B is diagram showing the excitation spectrums of the first and second phosphor materials excited by a light beam whose wavelength is 465 nm. The wavelength of the first phosphor material has a peak value, 522 nm, which is smaller than the peak value, 548 nm, of the second phosphor material.

As shown in FIG. 6A, the ratio of the emission intensity of the first phosphor material to that of the second phosphor material is 1:0.8 when excited by a blue beam whose wavelength is 455 nm. As shown in FIG. 6B, the ratio of the emission intensity of the first phosphor material to that of the second phosphor material is 1:1.1 when excited by a blue beam whose wavelength is 465 nm. It should be observed that when the wavelength of a blue beam increases, the emission intensity of the first phosphor material decreases, but the emission intensity of the second phosphor material increases. And, when the wavelength of a blue beam decreases, the emission intensity of the first phosphor material increases, but the emission intensity of the second phosphor material decreases. Therefore, the first and second phosphor materials of the first and second phosphor layers 110 and 120 do have the ability of self-adjusting their excitation intensities based on varying the wavelength of the blue beam.

After being excited by the blue beam, the first phosphor material emits a yellowish green beam, and the second phosphor material emits a reddish orange beam. The reddish orange beam of the second phosphor material has a tendency to absorb the yellowish green beam from the first phosphor material, weakening the generation of a white beam by mixing different colored beams. As shown in FIG. 1, the second phosphor layer 120 is nearer the blue LED 110 than the first phosphor layer 110, so that the second phosphor layer 120 is the first to be excited by the blue beam to emit the reddish orange beam. And then the first phosphor layer 110 is excited by the blue beam to emit the yellowish green beam. The yellowish green beam is generated after the reddish orange beam and has lower chance of being absorbed by the reddish orange beam, thereby generating a uniform white beam. Therefore, the generation of a white beam from the combination of different colored beams is not easily adversely affected as long as the sequence of the different colored beams is appropriate.

Although the second phosphor layer 120 is between the first phosphor layer 110 and the blue LED 100 in the present embodiment, the invention is not limited thereto. The positions of phosphor layers are determined based on their characteristics in other embodiments.

When the blue LED 100 includes, for example, a nitride compound semiconductor, the dominant wavelength of blue beam from the blue LED 100 is preferably within the range from 430 to 490 nm. It should be noted that, within the range shown in FIG. 5, both the first and second phosphor layers 110 and 120 have the characteristic of changing their excitation intensities according to the wavelength of the blue beam. Preferably, the blue LED 100 includes indium gallium nitride (InGaN) which has a dominant wavelength of 460 nm.

Figure 7:
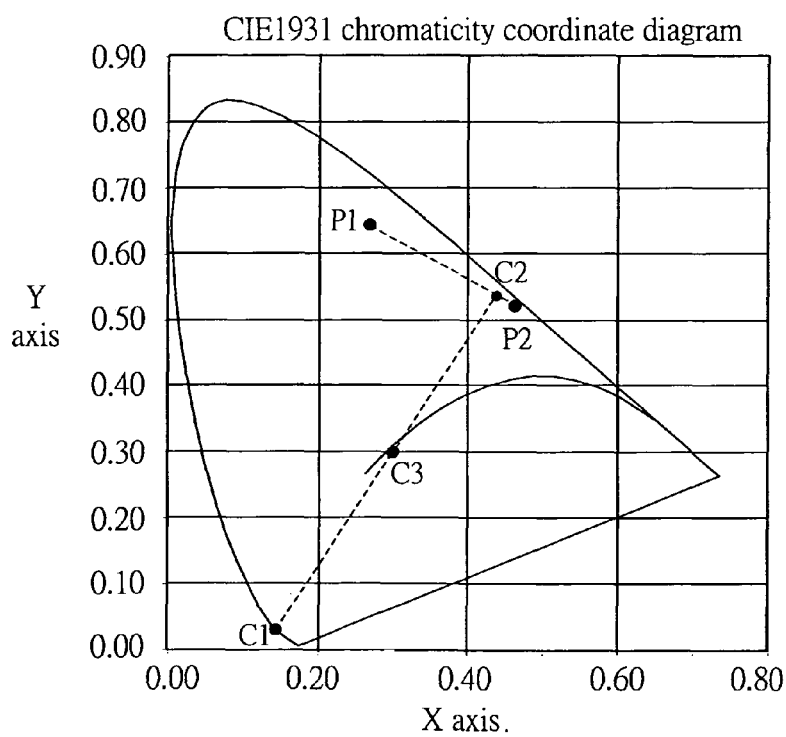
FIG. 7 shows the 1931 CIE (the Commission International de l'Eclairage) chromaticity diagram.

As shown in step 401 of the FIG. 4, the first chromaticity coordinate and emission intensity of the light beam from the blue LED 100 are measured when the blue LED 100 receives a predetermined amount of current. A current of 20 microampere (mA) is applied to the blue LED 100 which has indium gallium nitride. The first chromaticity coordinate is then measured and marked as C1 in FIG. 7, which shows the 1931 CIE (the Commission International de I'Eclairage) chromaticity diagram.

Next, as shown in step 402, the first and second phosphor materials are excited by a blue beam of a predetermined wavelength so as to emit light beams. A second chromaticity coordinate of the light beam from the first phosphor material and a third chromaticity coordinate of the light beam from the second phosphor material are then measured. The second chromaticity coordinate is marked as P1 in FIG. 7, and the third chromaticity coordinate is marked as P2. A blue beam whose wavelength is 460 nm is used as the excitation source.

Then, as shown in step 403, a target chromaticity coordinate of the target white beam is selected. According to the target chromaticity coordinate, the first, second and third chromaticity coordinates, a chromaticity coordinate of a mixed light beam is generated. For example, let the target chromaticity coordinate of the white beam be (0.3000, 0.310), which is marked as C3 in FIG. 7. Since the first to third chromaticity coordinates have been measured and marked as C1, P1 and P2, and the target chromaticity coordinate (C3) is known, the intersection point C2 of the line passing through C1 and C3 with the line passing through P1 and P2 is the position in the chromaticity coordinate required of the mixed light beam from the first and second phosphor materials. Thus, the chromaticity coordinate of the mixed light beam is found by solving the simultaneous equations of the two lines passing through C1 and C3 and through P1 and P2.

As shown in step 404, according to the chromaticity coordinate (C2) of the mixed light beam and the second and third chromaticity coordinates (P1 and P2), emission intensity relationship equations of the first and second phosphor materials are obtained. The emission intensities of the first and second phosphor materials are derived from a mixed light equation and calculated as $$x = \frac{m1x1/y1 + m2x2/y2}{m1/y1 + m2/y2} \quad (1)$$

$$y = \frac{m1y1/y1 + m2y2/y2}{m1/y1 + m2/y2} \quad (2)$$

In the above equations (1) and (2), (x, y) is the chromaticity coordinate of the mixed light beam of the two color beams, (x1, y1) and (x2, y2) are the chromaticity coordinates of the color beams, m1 is the intensity of the color beam having (x1, y1) as its chromaticity coordinate, and m2 is the intensity of the color beam having (x2, y2) as its chromaticity coordinate.

In step 404, the chromaticity coordinate marked as C2 of the mixed light beam of the first and second phosphor materials is (x, y). Let (x1, y1) be the second chromaticity coordinate, marked as P1, of the first phosphor material, and (x2, y2) be the third chromaticity coordinate, marked as P2, of the second phosphor material. The emission intensity of the first phosphor material is m1, and the emission intensity of the second phosphor material is m2. After substituting the known chromaticity coordinates (x, y), (x1, y1) and (x2, y2) into equations (1) and (2), and solving the simultaneous equations, the emission intensities, m1 and m2, of the first and second phosphor materials are obtained.

As shown in step 405, the weight ratio of the first phosphor material to the second phosphor material is determined on the basis of their emission intensities. The emission intensity of a phosphor material is related to its concentration. In addition, the relationship curve of the emission intensity and the concentration of a phosphor material can be determined through experimentation. Therefore, after m1 and m2 are calculated, the concentrations of the first and second phosphor materials are found from their relationship curves. Finally, the weight ratio of the first phosphor material to the second phosphor material is calculated.

As the blue beam whose wavelength is 455 nm is used as an excitation source, the ratio of emission intensity of the first phosphor material to that of the second phosphor material is 1:0.8. And, as the blue beam whose wavelength is 465 nm is used as an excitation source, the ratio of emission intensity of the first phosphor material to that of the second phosphor material is 1:1.1. Under these two conditions, the weight ratio of the first phosphor material to the second phosphor material is calculated so as to manufacture the first and second phosphor layers 110 and 120 containing glues. For example, the weight ratios of a silica gel glue to the first and second phosphor materials are 6:0.15 and 6:1, respectively.

When fabricating the light emitting apparatus 1, the transparent sealed body 130 is first formed outside the blue LED 100. The second and first phosphor layers 120 and 110 that have glues are sequentially formed over the transparent sealed body 130. The light emitting apparatus 1 that emits a white beam is a white LED. The white LEDs thus fabricated under the above two conditions are then tested.

Figure 8:
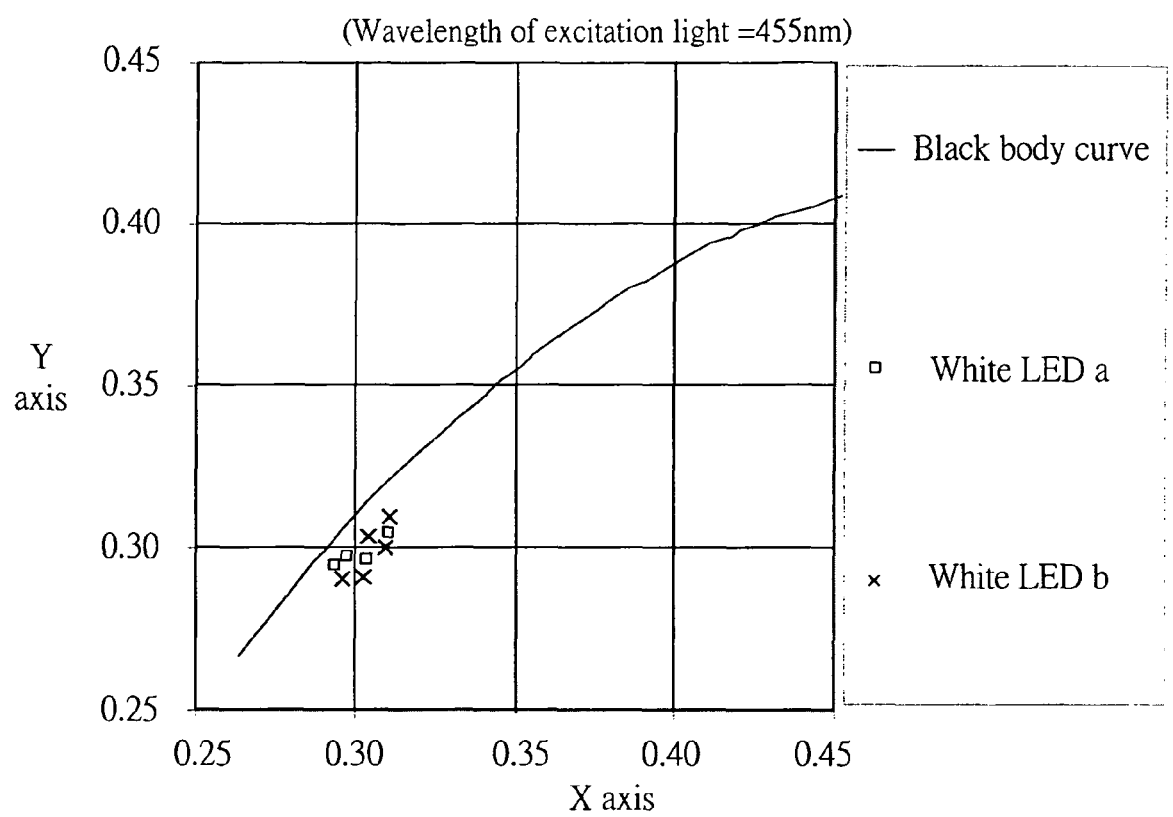
FIG. 8 is a chromaticity coordinate diagram showing the test results of two white LEDs having the blue LEDs of dominant wavelengths equal to 455 and 465 nm, respectively.

FIG. 8 is a chromaticity coordinate diagram showing the test results of two white LEDs having the blue LEDs of dominant wavelengths equal to 455 and 465 nm, respectively. As shown in FIG. 8, both of the chromaticity coordinates of the white LEDs are near the target chromaticity coordinate (0.300, 0.310).

The first phosphor material is made of the synthetic mixture $(Sr, Ba)_2SiO_4$:Eu, and the second phosphor material is made of the synthetic mixture $(Y_3Al_5O_{12}$:Ce, Gd) in the present embodiment, but the invention is not limited thereto.

In other embodiments, the first phosphor material is selected from $(Ba_xSr_yCa_z)_2SiO_4$:Eu phosphor, wherein x+y+z=1; or $(Ba_xSr_yCa_z)_3SiO_5$:Eu phosphor, wherein x+y+z=1; or $(Ba_xSr_yCa_z)_3SiO_5$:Ce, Li phosphor, wherein x+y+z=1; or $M_xGa_2S_4$:Eu phosphor, wherein $1 \leq x < 1.2$, and M is selected from a group consisting of calcium (Ca), strontium (Sr), barium (Ba) and magnesium (Mg) or the above-mentioned metal elements; or $M_{1-x}Si_2N_{2-y}O_{2-z}$:A phosphor, wherein $0<x\leq1$, $0\leq y\leq1$, $0\leq z\leq1$, M is selected from a group consisting of calcium (Ca), strontium (Sr), barium (Ba) and magnesium (Mg) or the above-mentioned metal elements, and A is selected from a group consisting of europium (Eu), cerium (Ce), manganese (Mn) and dysprosium (Dy) or the above-mentioned metal elements; or $Ca_3M_2Si_3O_{12}$:Ce phosphor, M is selected from a group consisting of strontium (Sr), scandium (Sc), magnesium (Mg) and barium (Ba) or the above-mentioned metal elements; or $CaSc_2O_4$:Ce phosphor; or $Ca_{8-x}(Mg, Mn)(SiO_4)_4Cl_2$:Eu phosphor, wherein $0 \leq x \leq 1$; or $M_xSi_{12-y-z}Al_{y+z}O_zN_{16-z}$:Ce phosphor, wherein $0<x\leq1$, $0\leq y\leq1$, $0\leq z\leq1$, M is selected from a group consisting of calcium (Ca), strontium (Sr), barium (Ba), magnesium (Mg), lithium (Li) and yttrium (Y) or the above-mentioned metal elements; or $M_xSi_{12-y-z}Al_{y+z}O_zN_{16-z}$:Yb phosphor, wherein $0<x\leq1$, $0\leq y\leq1$, $0\leq z\leq1$, M is selected from a group consisting of calcium (Ca), strontium (Sr), barium (Ba), magnesium (Mg), lithium (Li) and yttrium (Y) or the above-mentioned metal elements; or $M_xSi_{6-z}Al_zO_zN_{8-z}$:Eu phosphor, wherein $0<z\leq4.2$, M is selected from a group consisting of calcium (Ca), strontium (Sr), barium (Ba) and magnesium (Mg) or the above-mentioned metal elements.

Moreover, preferably the mean value of the particle diameters of the first phosphor material is less than 20 μm. In addition, when the number of the particles of the first phosphor material is about 10% of the total number of the particles of the first and second materials, the particle diameter of the first phosphor material is equal to or less than 5 μm. When the number of the particles of the first phosphor material is about 50% of the total number of the particles of the first and second materials, the particle diameter of the first phosphor material is equal to or less than 15 μm. And, when the number of the particles of the first phosphor material is about 90% of the total number of the particles of the first and second materials, the particle diameter of the first phosphor material is equal to or less than 25 μm.

In other embodiments, the second phosphor material is selected from a garnet phosphor activated by cerium (Ce) and composed of at least one element of yttrium (Y), terbium (Tb), lanthanum (La), gadolinium (Gd) and samarium (Sm) and at least one element of aluminum (Al), gallium (Ga), indium (In) and iron (Fe); or $M_xS$:Eu phosphor, wherein $1 \leq x < 1.2$, and M is selected from a group consisting of calcium (Ca), strontium (Sr) and barium (Ba) or the above-mentioned metal elements; or $Ca_xAl_ySi_zN_3$:Ce phosphor, wherein $0<x\leq1$, $0<y\leq1$, $0<z\leq1$; or $(Ca_xAl_{1-x})Si_yN_{2-y}O_z$:Ce phosphor, wherein $0<x\leq1$, $0<y\leq1$, $0<z\leq1$; or $M_{1-x}Si_2N_{2-y}O_{2-z}$:Yb phosphor, wherein $0<x\leq1$, $0\leq y\leq1$, $0\leq z\leq1$, and M is selected from a group consisting of calcium (Ca), strontium (Sr) and barium (Ba) or the above-mentioned metal elements; or $M_{2-x}Si_5N_{8-y}$:N phosphor, wherein $0<x\leq1$, $0\leq y\leq1$, M is selected from a group consisting of calcium (Ca), strontium (Sr) and barium (Ba) or the above-mentioned metal elements, and N is selected from a group consisting of europium (Eu), cerium (Ce), manganese (Mn) and dysprosium (Dy) or the above-mentioned metal elements; or $A_{2-x}(MF_6)$:Mn phosphor, wherein $0<x\leq1$, A is selected from a group consisting of potassium (K), rubidium (Rb) and cesium (Cs) or the above-mentioned metal elements, and M is selected from a group consisting of silicon (Si), germanium (Ge) and titanium (Ti) or the above-mentioned metal elements; or $MAlSiN_3$:Eu phosphor, M is selected from a group consisting of calcium (Ca), strontium (Sr) and barium (Ba) or the above-mentioned metal elements; or $M_xSi_{12-y-z}Al_{y+z}O_zN_{16-z}$:Eu phosphor, wherein $0<x\leq1$, $0\leq y\leq1$, $0\leq z\leq1$, M is selected from a group consisting of calcium (Ca), strontium (Sr), barium (Ba), magnesium (Mg), lithium (Li) and yttrium (Y) or the above-mentioned metal elements.

Preferably, the mean value of the particle diameters of the second phosphor material is less than 20 μm. Moreover, when the number of the particles of the second phosphor material is about 10% of the total number of the particles of the first and second materials, the particle diameter of the second phosphor material is equal to or less than 5 μm. When the number of the particles of the second phosphor material is about 50% of the total number of the particles of the first and second materials, the particle diameter of the second phosphor material is equal to or less than 15 μm. And when the number of the particles of the second phosphor material is about 90% of the total number of the particles of the first and second materials, the particle diameter of the second phosphor material is equal to or less than 25 μm.

It should be noted that the first and second phosphor materials can also be selected from a group consisting of $(Ba_xSr_yCa_z)_2SiO_4$:Eu phosphor, $(Ba_xSr_yCa_z)SiO_5$:Eu phosphor, and $(Ba_xSr_yCa_z)_3SiO_5$:Ce, Li phosphor, wherein $x+y+z=1$.

Second Embodiment

The light emitting apparatus in the second embodiment differs from that of the first embodiment in the location of the deposited phosphor layer. The materials of the blue LED and phosphors are the same as that of the first embodiment, as is the method of preparation for the phosphors. We do not repeat the explanation here.

Figure 9:
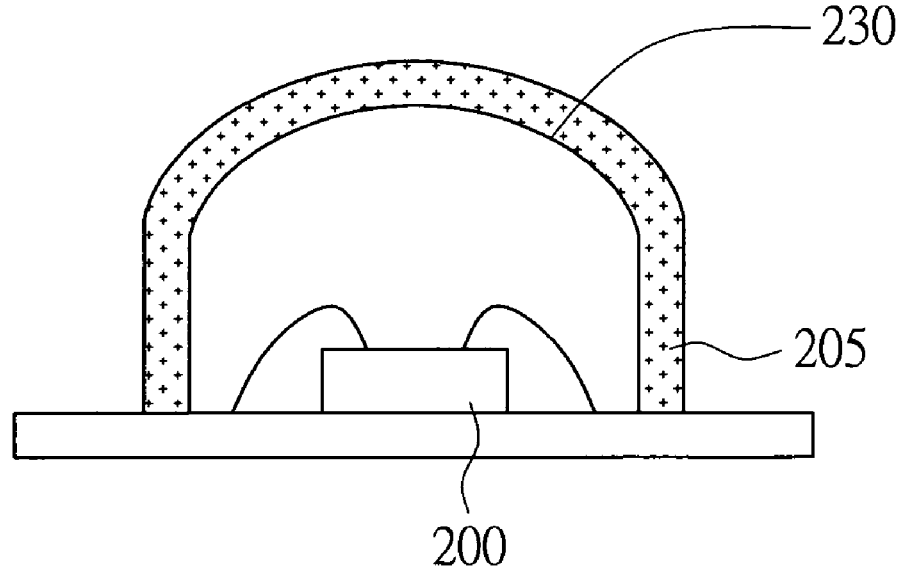
FIG. 9 is a diagram showing a light emitting apparatus according to the second embodiment of the invention.

FIG. 9 is a diagram showing a light emitting apparatus according to the second embodiment of the invention. The light emitting apparatus 2 includes a blue LED 200, a phosphor layer 205 and a transparent sealed body 230. The blue LED 200 is received within the transparent sealed body 230. The phosphor layer 205, which is a thin film, is formed over the transparent sealed body 230 by coating, and is separated from the blue LED 200. The phosphor layer 205 includes a first phosphor material and a second phosphor material that are excited by a blue beam from the blue LED 200.

The first and second phosphor materials of the phosphor layer 205 have the characteristic that the wavelength of the peak intensity of the light beam from the first phosphor material is shorter than that of the second phosphor material. Moreover, when a blue beam of a shorter wavelength excites the phosphor materials, the excitation efficiency of the first phosphor material is greater than that of the second phosphor material. And when a blue beam of a longer wavelength excites the phosphor materials, the excitation efficiency of the first phosphor material is less than that of the second phosphor material. The dividing value between the shorter wavelength and the longer wavelength is within the range from a first wavelength to a second wavelength. Preferably, the first wavelength is approximately 440 nm, and the second wavelength is approximately 480 nm.

The method of preparation of the first and second phosphor materials of the phosphor layer 205 in the embodiment is the same as that of the first embodiment. After the weight ratio of the first phosphor material to the second phosphor material is determined, the phosphor materials are blended and a glue, such as a silica gel, is added so that the phosphor layer 205 adheres to the outer surface of the transparent sealed body 230.

Figure 10:
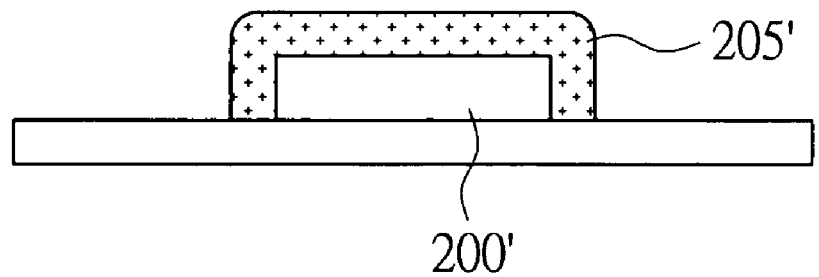
FIG. 10 is a diagram showing that the phosphor layer is a conformal phosphor.

FIG. 10 is a diagram showing that the phosphor layer is a conformal phosphor. The phosphor layer 205' of the light emitting apparatus 2' is disposed directly on the blue LED 200' to form as a single-layer thin film.

As shown in FIG. 9, since the phosphor layer 205 is separated from the blue LED 200, the volume of the light emitting apparatus 2 is enlarged by the space between the LED 200 and the phosphor layer 205, which, in turn, increases the size of light emitting area, thereby producing greater light emission. As for the light emitting apparatus 2' in FIG. 10, the phosphor layer 205' completely covers the outer surface of the blue LED 200', so that the light emitting apparatus 2' has significant luminous intensity and is capable of emitting a concentrated beam of light. The light emitting apparatus 2 and 2' differ in structure, and therefore, they can be applied to the same or to different varieties of products.

It should be noted that the invention is not limited to the light emitting apparatus disclosed in the first and second embodiments. Any light emitting apparatus that has a single-layer or double-layer thin film of two phosphor materials prepared based on a specific weight ratio disposed over a blue LED or separated from the blue LED is within the scope of the invention. Moreover, any light emitting apparatus that is fabricated on the basis of an open loop control theory to form a white LED is also within the scope of the invention. In addition, the first and second phosphor materials have the characteristics stated below. First, the wavelength of the peak intensity of the first phosphor material is shorter than that of the second phosphor material. Second, when a blue beam of a shorter wavelength is used to excite the phosphor materials, the excitation efficiency of the first phosphor material is greater than that of the second phosphor material, and when a blue beam of a longer wavelength is used to excite the phosphor materials, the excitation efficiency of the first phosphor material is less than that of the second phosphor material.

Based on the characteristics of the phosphor materials, when the wavelength of blue beam from the blue LED changes, the chromaticity coordinate of the mixed light beam from the phosphor materials is adjusted accordingly. Therefore, although the wavelength of the blue beam from the blue LED is unstable, the chromaticity coordinate of the mixed light beam from the phosphor materials is maintained at a constant position.

The light emitting apparatus disclosed in the above embodiments of the invention makes use of two phosphor materials and a blue LED to generate a white beam. The phosphor materials have their varieties and amounts determined in advance and are formed as a single-layer or double-layer thin film over the blue LED by a simple manufacturing method. The light emitting apparatus of the invention needs no extra control circuits to automatically keep the chromaticity coordinate of the white beam at a constant position, thereby reducing the manufacturing cost. Therefore, compared with the white LEDs manufactured by conventional methods and their methods of compensation for white beams, the light emitting apparatus of the invention has a higher marketing value.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting apparatus with open loop control, comprising:
   a blue light emitting diode (LED);
   a first phosphor layer disposed above the blue LED, wherein the first phosphor layer has a first phosphor material that is excited by a blue beam from the blue LED to emit a first light beam; and
   a second phosphor layer disposed between the blue LED and the first phosphor layer, wherein the second phosphor layer has a second phosphor material that is excited by the blue beam from the blue LED to emit a second light beam, such that the blue beam, first light beam and second light beam are mixed white light;
   wherein when the blue beam of a shorter wavelength excites the first and second phosphor layers, the excitation efficiency of the first phosphor layer is greater than that of the second phosphor layer; when the blue beam of a longer wavelength excites the first and second phosphor layers, the excitation efficiency of the first phosphor layer is less than that of the second phosphor layer; the wavelength of the peak intensity of the first light beam from the first phosphor layer is shorter than the second light beam of the second phosphor layer, and the dividing value between the short wavelength and the long wavelength is within the range from a first wavelength to a second wavelength; the weight ratio of the first phosphor material to the second phosphor material is determined according to the emission intensities of the first and second phosphor materials.

2. The light emitting apparatus according to claim 1, wherein the second phosphor layer covers the blue LED directly, and the first phosphor layer covers the second phosphor layer directly.

3. The light emitting apparatus according to claim 1, further comprising:
   a transparent sealed body for receiving the blue LED, wherein the second phosphor layer is disposed over the transparent sealed body, and the first phosphor layer is disposed over the second phosphor layer.

4. The light emitting apparatus according to claim 1, wherein the second phosphor layer is formed over the blue LED by coating and the first phosphor layer is formed over the second phosphor layer by coating.

5. A light emitting apparatus with open loop control, comprising:
   a blue light emitting diode (LED);
   a first phosphor layer disposed above the blue LED, wherein the first phosphor layer has a first phosphor material that is excited by a blue beam from the blue LED to emit a first light beam; and
   a second phosphor layer disposed between the blue LED and the first phosphor layer, wherein the second phosphor layer has a second phosphor material that is excited by the blue beam from the blue LED to emit a second light beam, such that the blue beam, first light beam and second light beam are mixed white light;
   wherein when the blue beam of a shorter wavelength excites the first and second phosphor layers, the excitation efficiency of the first phosphor layer is greater than that of the second phosphor layer; when the blue beam of a longer wavelength excites the first and second phosphor layers, the excitation efficiency of the first phosphor layer is less than that of the second phosphor layer; the wavelength of the peak intensity of the first light beam from the first phosphor layer is shorter than the second light beam of the second phosphor layer, and the dividing value between the short wavelength and the long wavelength is within the range from a first wavelength to a second wavelength;
   wherein the first wavelength is approximately 440 nm, and the second wavelength is approximately 480 nm.

6. The light emitting apparatus according to claim 1, wherein when the blue LED comprises a nitride compound semiconductor, the dominant wavelength of the blue beam from the blue LED is within the range from 430 to 490 nm.

7. A light emitting apparatus with open loop control, comprising:
   a blue light emitting diode (LED);
   a first phosphor layer disposed above the blue LED, wherein the first phosphor layer has a first phosphor material that is excited by a blue beam from the blue LED to emit a first light beam; and
   a second phosphor layer disposed between the blue LED and the first phosphor layer, wherein the second phosphor layer has a second phosphor material that is excited by the blue beam from the blue LED to emit a second light beam, such that the blue beam, first light beam and second light beam are mixed white light;
   wherein when the blue beam of a shorter wavelength excites the first and second phosphor layers, the excitation efficiency of the first phosphor layer is greater than that of the second phosphor layer; when the blue beam of a longer wavelength excites the first and second phosphor layers, the excitation efficiency of the first phosphor layer is less than that of the second phosphor layer; the wavelength of the peak intensity of the first light beam from the first phosphor layer is shorter than the second light beam of the second phosphor layer, and the dividing value between the short wavelength and the long wavelength is within the range from a first wavelength to a second wavelength;
   the first fluorescent material and the second fluorescent material satisfy at least one of the following conditions (1), (2) and (3):
   (1) the first phosphor material is $(Ba_xSr_yCa_z)_2SiO_4$:Eu phosphor, wherein x+y+z=1; or $(Ba_xSr_yCa_z)_3SiO_5$:Eu phosphor, wherein x+y+z=1; or $(Ba_xSr_yCa_z)_3SiO_5$:Ce, Li phosphor, wherein x+y+z=1; or $M_xGa_2S_4$:Eu phosphor, wherein $1 \leq x < 1.2$, and M is selected from a group consisting of calcium (Ca), strontium (Sr), barium (Ba) and magnesium (Mg) or the above-mentioned metal elements; or $M_{1-x}Si_2N_{2-y}O_{2-z}$:A phosphor, wherein $0<x\leq1$, $0\leq y\leq1$, $0\leq z\leq1$, M is selected from a group consisting of calcium (Ca), strontium (Sr), barium (Ba) and magnesium (Mg) or the above-mentioned metal elements, and A is selected from a group consisting of europium (Eu), cerium (Ce), manganese (Mn) and dysprosium (Dy) or the above-mentioned metal elements; or $Ca_3M_2Si_3O_{12}$:Ce phosphor, M is selected from a group consisting of strontium (Sr), scandium (Sc), magnesium (Mg) and barium (Ba) or the above-mentioned metal elements; or $CaSc_2O_4$:Ce phosphor; or $Ca_{8-x}(Mg, Mn)(SiO_4)_4Cl_2$:Eu phosphor, wherein $0<x\leq1$; or $M_xS_{12-y-z}Al_{y+z}O_zN_{16-z}$:Ce phosphor, wherein $0<x\leq1$, $0\leq y\leq1$, $0\leq z\leq1$, M is selected from a group consisting of calcium (Ca), strontium (Sr), barium (Ba), magnesium (Mg), lithium (Li) and yttrium (Y) or the above-mentioned metal elements; or $M_xSi_{12-y-z}Al_{y+z}O_zN_{16-z}$:Yb phosphor, wherein $0<x\leq1$, $0\leq y\leq1$, $0\leq z\leq1$, M is selected from a group consisting of calcium (Ca), strontium (Sr), barium (Ba), magnesium (Mg), lithium (Li) and yttrium (Y) or the above-mentioned metal elements; or $M_xSi_{6-z}Al_zO_zN_{8-z}$:Eu phosphor, wherein $0<z\leq4.2$, M is selected from a group consisting of calcium (Ca), strontium (Sr), barium (Ba) and magnesium (Mg) or the above-mentioned metal elements;

(2) the second phosphor material is a garnet phosphor activated by cerium (Ce) and composed of at least one element of yttrium (Y), terbium (Tb), lanthanum (La), gadolinium (Gd) and samarium (Sm) and at least one element of aluminum (Al), gallium (Ga), indium (In) and iron (Fe); or $M_xS$:Eu phosphor, wherein $1 \leq x < 1.2$, and M is selected from a group consisting of calcium (Ca), strontium (Sr) and barium (Ba) or the above-mentioned metal elements; or $Ca_xAl_ySi_zN_3$:Ce phosphor, wherein $0<x\leq1$, $0<y\leq1$, $0<z\leq1$; or $(Ca_xAl_{1-x})Si_yN_{2-z}O_z$:Ce phosphor, wherein $0<x\leq1$, $0<y\leq1$, $0<z\leq1$; or $M_{1-x}Si_2N_{2-y}O_{2-z}$:Yb phosphor, wherein $0<x\leq1$, $0\leq y\leq1$, $0\leq z\leq1$, and M is selected from a group consisting of calcium (Ca), strontium (Sr) and barium (Ba) or the above-mentioned metal elements; or $M_{2-x}Si_5N_{8-y}$:N phosphor, wherein $0<x\leq1$, $0\leq y\leq1$, M is selected from a group consisting of calcium (Ca), strontium (Sr) and barium (Ba) or the above-mentioned metal elements, and N is selected from a group consisting of europium (Eu), cerium (Ce), manganese (Mn) and dysprosium (Dy) or the above-mentioned metal elements; or $A_{2-x}(MF_6)$:Mn phosphor, wherein $0<x\leq1$, A is selected from a group consisting of potassium (K), rubidium (Rb) and cesium (Cs) or the above-mentioned metal elements, and M is selected from a group consisting of silicon (Si), germanium (Ge) and titanium (Ti) or the above-mentioned metal elements; or $MAlSiN_3$:Eu phosphor, M is selected from a group consisting of calcium (Ca), strontium (Sr) and barium (Ba) or the above-mentioned metal elements; or $M_xSi_{12-y-z}Al_{y+z}O_zN_{16-z}$:Eu phosphor, wherein $0<x\leq1$, $0\leq y\leq1$, $0\leq z\leq1$, M is selected from a group consisting of calcium (Ca), strontium (Sr), barium (Ba), magnesium (Mg), lithium (Li) and yttrium (Y) or the above-mentioned metal elements; and (3) the first and second phosphor materials are selected from a group consisting of $(Ba_zSr_yCa_z)_2SiO_4$:Eu phosphor, $(Ba_xSr_yCa_z)_3SiO_5$:Eu phosphor, and $(Ba_zSr_yCa_z)_3SiO_5$:Ce, Li phosphor, $x+y+z=1$.

8. The light emitting apparatus according to claim 7, wherein the mean value of the particle diameters of the first phosphor material is less than 20 μm.

9. The light emitting apparatus according to claim 7, wherein
when the number of the particles of the first phosphor material is about 10% of the total number of the particles of the first and second phosphor materials, the particle diameter of the first phosphor material is equal to or less than 5 μm;
when the number of the particles of the first phosphor material is about 50% of the total number of the particles of the first and second phosphor materials, the particle diameter of the first phosphor material is equal to or less than 15 μm;
when the number of the particles of the first phosphor material is about 90% of the total number of the particles of the first and second phosphor materials, the particle diameter of the first phosphor material is equal to or less than 25 μm.

10. The light emitting apparatus according to claim 7, wherein the mean value of the particle diameters of the second phosphor material is less than 20 μm.

11. The light emitting apparatus according to claim 7, wherein
when the number of the particles of the second phosphor material is about 10% of the total number of the particles of the first and second phosphor materials, the particle diameter of the second phosphor material is equal to or less than 5 μm;
when the number of the particles of the second phosphor material is about 50% of the total number of the particles of the first and second phosphor materials, the particle diameter of the second phosphor material is equal to or less than 15 μm;
when the number of the particles of the second phosphor material is about 90% of the total number of the particles of the first and second phosphor materials, the particle diameter of the second phosphor material is equal to or less than 25 μm.

12. A light emitting apparatus with open loop control, comprising:
a blue LED; and
a phosphor layer covering the blue LED, and having a first phosphor material and a second phosphor material, wherein the first and second phosphor materials are excited by a blue beam from the blue LED to emit a first light beam and a second light beam, such that the blue beam, first light beam and second light beam are mixed white light;
wherein when the blue beam of a shorter wavelength excites the first and second phosphor materials, the excitation efficiency of the first phosphor material is greater than that of the second phosphor material; when the blue beam of a longer wavelength excites the first and second phosphor materials, the excitation efficiency of the first phosphor material is less than that of the second phosphor material; the wavelength of the peak intensity of the first light beam from the first phosphor material is shorter than the second light beam of the second phosphor material, and the dividing value between the shorter wavelength and the longer wavelength is within the range from a first wavelength to a second wavelength;
wherein the weight ratio of the first phosphor material to the second phosphor material is determined according to the emission intensities of the first and second phosphor materials.

13. The light emitting apparatus according to claim 12, further comprising:
a transparent sealed body for receiving the blue LED, wherein the phosphor layer is disposed over the transparent sealed body.

14. A light emitting apparatus with open loop control, comprising:
a blue LED; and
a phosphor layer covering the blue LED, and having a first phosphor material and a second phosphor material, wherein the first and second phosphor materials are excited by a blue beam from the blue LED to emit a first light beam and a second light beam, such that the blue beam, first light beam and second light beam are mixed white light;
wherein when the blue beam of a shorter wavelength excites the first and second phosphor materials, the excitation efficiency of the first phosphor material is greater than that of the second phosphor material; when the blue beam of a longer wavelength excites the first and second phosphor materials, the excitation efficiency of the first phosphor material is less than that of the second phosphor material, the wavelength of the peak intensity of the first light beam from the first phosphor material is shorter than the second light beam of the second phosphor material, and the dividing value between the shorter wavelength and the longer wavelength is within the range from a first wavelength to a second wavelength;

wherein the first wavelength is approximately 440 nm, and the second wavelength is approximately 480 nm.

15. The light emitting apparatus according to claim 14, wherein when the blue LED comprises a nitride compound semiconductor, the dominant wavelength of blue beam from the blue LED is within the range from 430 to 490 nm.

16. A light emitting apparatus with open loop control, comprising:
- a blue LED; and
- a phosphor layer covering the blue LED, and having a first phosphor material and a second phosphor material, wherein the first and second phosphor materials are excited by a blue beam from the blue LED to emit a first light beam and a second light beam, such that the blue beam, first light beam and second light beam are mixed white light;

wherein when the blue beam of a shorter wavelength excites the first and second phosphor materials, the excitation efficiency of the first phosphor material is greater than that of the second phosphor material; when the blue beam of a longer wavelength excites the first and second phosphor materials, the excitation efficiency of the first phosphor material is less than that of the second phosphor material, the wavelength of the peak intensity of the first light beam from the first phosphor material is shorter than the second light beam of the second phosphor material, and the dividing value between the shorter wavelength and the longer wavelength is within the range from a first wavelength to a second wavelength;

the first fluorescent material and the second fluorescent material satisfy at least one of the following conditions (1), (2) and (3):

(1) the first phosphor material is $(Ba_xSr_yCa_z)_2SiO_4$:Eu phosphor, wherein x+y+z=1; or $(Ba_xSr_yCa_z)_3SiO_5$:Eu phosphor, wherein x+y+z=1; or $(Ba_xSr_yCa_z)_3SiO_5$:Ce, Li phosphor, wherein x+y+z=1; or $M_xGa_2S_4$:Eu phosphor, wherein 1≦x<1.2, and M is selected from a group consisting of calcium (Ca), strontium (Sr), barium (Ba) and magnesium (Mg) or the above-mentioned metal elements; or $M_{1-x}Si_2N_{2-y}O_{2-z}$:A phosphor, wherein 0<x≦1, 0≦y≦1, 0≦z≦1, M is selected from a group consisting of calcium (Ca), strontium (Sr), barium (Ba) and magnesium (Mg) or the above-mentioned metal elements, and A is selected from a group consisting of europium (Eu), cerium (Ce), manganese (Mn) and dysprosium (Dy) or the above-mentioned metal elements; or $Ca_3M_2Si_3O_{12}$:Ce phosphor, M is selected from a group consisting of strontium (Sr), scandium (Sc), magnesium (Mg) and barium (Ba) or the above-mentioned metal elements; or $CaSc_2O_4$:Ce phosphor; or $Ca_{8-x}(Mg, Mn)(SiO_4)_4Cl_2$:Eu phosphor, wherein 0<x≦1; or $M_xSi_{12-y-z}Al_{y+z}O_zN_{16-z}$:Ce phosphor, wherein 0<x≦1, 0≦y≦1, 0≦z≦1, M is selected from a group consisting of calcium (Ca), strontium (Sr), barium (Ba), magnesium (Mg), lithium (Li) and yttrium (Y) or the above-mentioned metal elements; or $M_xSi_{12-y-z}Al_{y+z}O_zN_{16-z}$:Yb phosphor, wherein 0<x≦1, 0≦y≦1, 0≦z≦1, M is selected from a group consisting of calcium (Ca), strontium (Sr), barium (Ba), magnesium (Mg), lithium (Li) and yttrium (Y) or the above-mentioned metal elements; or $M_xSi_{6-z}Al_zO_zN_{8-z}$:Eu phosphor, wherein 0<z≦4.2, M is selected from a group consisting of calcium (Ca), strontium (Sr), barium (Ba) and magnesium (Mg) or the above-mentioned metal elements;

(2) the second phosphor material is a garnet phosphor activated by cerium (Ce) and composed of at least one element of yttrium (Y), terbium (Tb), lanthanum (La), gadolinium (Gd) and samarium (Sm) and at least one element of aluminum (Al), gallium (Ga), indium (In) and iron (Fe); or $M_xS$:Eu phosphor, wherein 1≦x<1.2, and M is selected from a group consisting of calcium (Ca), strontium (Sr) and barium (Ba) or the above-mentioned metal elements; or $Ca_xAl_ySi_zN_3$:Ce phosphor, wherein 0<x≦1, 0<y≦1, 0<z≦1; or $(Ca_xAl_{1-x})Si_yN_{2-z}O_z$:Ce phosphor, wherein 0<x≦1, 0<y≦1, 0<z≦1; or $M_{1-x}Si_2N_{2-y}O_{2-z}$:Yb phosphor, wherein 0<x≦1, 0≦y≦1, 0≦z≦1, and M is selected from a group consisting of calcium (Ca), strontium (Sr) and barium (Ba) or the above-mentioned metal elements; or $M_{2-z}Si_5N_{8-y}$:N phosphor, wherein 0<x≦1, 0≦y≦1, M is selected from a group consisting of calcium (Ca), strontium (Sr) and barium (Ba) or the above-mentioned metal elements, and N is selected from a group consisting of europium (Eu), cerium (Ce), manganese (Mn) and dysprosium (Dy) or the above-mentioned metal elements; or $A_{2-x}(MF_6)$:Mn phosphor, wherein 0<x≦1, A is selected from a group consisting of potassium (K), rubidium (Rb) and cesium (Cs) or the above-mentioned metal elements, and M is selected from a group consisting of silicon (Si), germanium (Ge) and titanium (Ti) or the above-mentioned metal elements; or $MAlSiN_3$:Eu phosphor, M is selected from a group consisting of calcium (Ca), strontium (Sr) and barium (Ba) or the above-mentioned metal elements; or $M_zSi_{12-y-z}Al_{y+z}O_zN_{16-z}$:Eu phosphor, wherein 0<x≦1, 0≦y≦1, 0≦z≦1, M is selected from a group consisting of calcium (Ca), strontium (Sr), barium (Ba), magnesium (Mg), lithium (Li) and yttrium (Y) or the above-mentioned metal elements; and (3) the first and second phosphor materials are selected from a group consisting of $(Ba_xSr_yCa_z)_2SiO_4$:Eu phosphor, $(Ba_xSr_yCa_z)_3SiO_5$:Eu phosphor, and $(Ba_xSr_yCa_z)_3SiO_5$:Ce, Li phosphor, x+y+z=1.

17. The light emitting apparatus according to claim 16, wherein when the number of the particles of the first phosphor material is about 10% of the total number of the particles of the first and second phosphor materials, the particle diameter of the first phosphor material is equal to or less than 5 μm;

when the number of the particles of the first phosphor material is about 50% of the total number of the particles of the first and second phosphor materials, the particle diameter of the first phosphor material is equal to or less than 15 μm;

when the number of the particles of the first phosphor material is about 90% of the total number of the particles of the first and second phosphor materials, the particle diameter of the first phosphor material is equal to or less than 25 μm.

18. The light emitting apparatus according to claim 16, wherein when the number of the particles of the second phosphor material is about 10% of the total number of the particles of the first and second phosphor materials, the particle diameter of the second phosphor material is equal to or less than 5 µm;

when the number of the particles of the second phosphor material is about 50% of the total number of the particles of the first and second phosphor materials, the particle diameter of the second phosphor material is equal to or less than 15 µm;

when the number of the particles of the second phosphor material is about 90% of the total number of the particles of the first and second phosphor materials, the particle diameter of the second phosphor material is equal to or less than 25 µm.

\* \* \* \* \*